United States Patent [19]

Sakamoto et al.

[11] Patent Number: 5,574,621
[45] Date of Patent: Nov. 12, 1996

[54] INTEGRATED CIRCUIT CAPACITOR HAVING A CONDUCTIVE TRENCH

[75] Inventors: Kurt K. Sakamoto, Chandler; Neil T. Tracht; Robert A. Pryor, both of Mesa, all of Ariz.

[73] Assignee: Motorola, Inc., Schaumburg, Ill.

[21] Appl. No.: 411,194

[22] Filed: Mar. 27, 1995

[51] Int. Cl.$^6$ .......................... H01G 4/06; H01L 27/108
[52] U.S. Cl. ..................... 361/321.1; 361/321.2; 252/301
[58] Field of Search .................. 361/321.1, 321.2, 361/321.3, 321.4, 321.5, 322, 328–330; 257/301–302, 304–305

[56] References Cited

U.S. PATENT DOCUMENTS

| | | | |
|---|---|---|---|
| 5,181,089 | 1/1993 | Matsuo et al. | 257/299 |
| 5,187,550 | 2/1993 | Yanagisawa | 257/301 |
| 5,428,236 | 6/1995 | Uchida | 257/305 |
| 5,442,584 | 8/1995 | Jeong et al. | 365/149 |

*Primary Examiner*—Bot L. Ledynh
*Attorney, Agent, or Firm*—Bruce T. Neel

[57] ABSTRACT

A capacitor (58) for an integrated circuit having a conductive trench (50), disposed below a bottom electrode layer (52), that electrically connects the bottom electrode layer to a semiconductor substrate (14, 16). The conductive trench eliminates the need for a top-side contact to the bottom electrode layer. The semiconductor substrate is, for example, connected to ground.

12 Claims, 4 Drawing Sheets

INTEGRATED CIRCUIT CAPACITOR HAVING A CONDUCTIVE TRENCH

BACKGROUND OF THE INVENTION

The present invention relates, in general, to integrated circuits and, more particularly, to a capacitor structure for an integrated circuit that has a conductive trench.

Capacitors are a fundamental component of a typical integrated circuit, and numerous capacitor structures exist depending on the particular circuit application desired. One such structure is known as a "bypass capacitor", which is used for example to reduce noise on voltage supply lines for integrated circuits operating at high frequencies.

A typical prior bypass capacitor uses a top electrode of metal, a bottom electrode of heavy-doped polysilicon, and a dielectric of silicon nitride. However, a disadvantage of this prior capacitor is that the bottom electrode requires a metal contact formed through some of the overlying layers of the integrated circuit. This contact to the bottom electrode requires additional surface area on the integrated circuit and causes a significantly high series resistance across the bottom electrode. This is so because the bottom electrode typically has a sheet resistance of about 140 ohms/square, and the contact to the bottom electrode is usually made at only one end of the electrode. Thus, there exists a high resistance across the bottom electrode from the contacted end to the opposite end of the electrode. A further disadvantage of this prior capacitor is that either the metal contact to the top electrode or the metal contact to the bottom electrode must be routed across the top of the integrated circuit layout for connection to a ground or other lowest potential source.

Accordingly, there is a need for an integrated circuit capacitor that reduces the series resistance of the bottom electrode, reduces the integrated circuit surface area required for the capacitor, and eliminates the need for metal routing over the surface of the integrated circuit to connect a capacitor electrode to a lowest potential source.

DETAILED DESCRIPTION OF THE DRAWINGS

Briefly stated, the present invention provides a capacitor for an integrated circuit comprising a conductive trench, disposed below a bottom electrode layer, that electrically connects the bottom electrode layer to a semiconductor substrate. A semiconductor layer having a conductivity type opposite to that of the semiconductor substrate and an insulating layer are disposed overlying the semiconductor substrate, and the conductive trench extends through both the insulating layer and the semiconductor layer down to the semiconductor substrate. In one embodiment, the conductive trench permits the connection of the bottom electrode layer to a ground reference potential, which is connected to the substrate.

Figure 1:
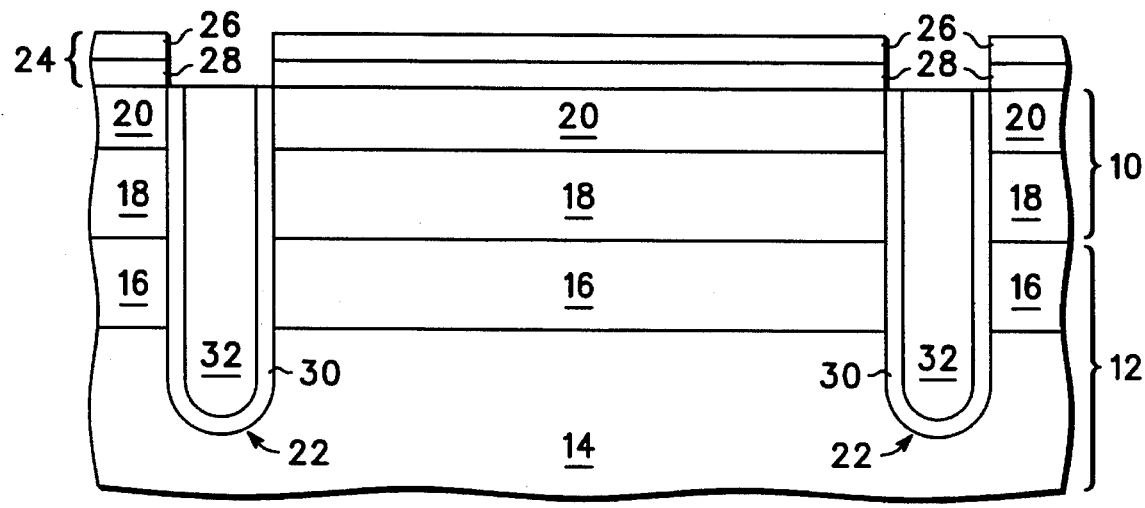
FIGS. 1–8 are cross-sectional views illustrating sequential steps in the manufacture of a capacitor according to the present invention.

The present invention can be more fully described with reference to FIGS. 1–8, which are cross-sectional views illustrating the manufacture of a capacitor according to the present invention. In FIG. 1, a semiconductor layer 10 has been formed on a semiconductor substrate 12. Semiconductor layer 10 comprises a heavily-doped N-type epitaxial buried layer 18 and a lightly-doped N-type epitaxial layer 20. Semiconductor substrate 12 comprises a heavily-doped P-type semiconductor wafer 14 and an overlying lightly-doped P-type epitaxial layer 16. Wafer 14 is, for example, silicon with a bulk resistivity of 0.09–0.11 ohm-cm, and epitaxial layer 20 has a thickness of, for example, about one micron. Epitaxial layers 16, 18, and 20 are formed on wafer 14 using conventional techniques and are, for example, silicon.

Isolation trenches 22 have been formed using known methods, such as reactive ion etching. A previously patterned hard-mask 24 defines the locations of isolation trenches 22 prior to etching, as is known. Hard-mask 24, for example, comprises an oxide layer 26 having a thickness of about 2,600 angstroms, a nitride layer 28 having a thickness of about 1,500 angstroms, a polysilicon layer (not shown) disposed directly underneath nitride layer 28 having a thickness of about 500 angstroms, and an oxide layer (not shown) disposed directly underneath the polysilicon layer (not shown) and on epitaxial layer 20 having a thickness of about 150 angstroms. Oxide layer 26 is, for example, formed from a tetraethylorthosilicate (TEOS) layer that has been cured in a furnace, as is known.

After isolation trenches 22 have been etched, a liner oxide 30 is formed on the walls of trenches 22, and another polysilicon layer (not shown) is deposited and etched-back to provide a polysilicon fill 32 in trenches 22. For example, liner oxide 30 has a thickness of about 3,000 angstroms as formed by a conventional furnace TEOS process, and the polysilicon layer (not shown) used to provide fill 32 is deposited to a thickness of about 8,000 angstroms. Isolation trenches 22 have, for example, a depth of about 5 microns, and polysilicon fill 32 is preferably un-doped.

Figure 2:
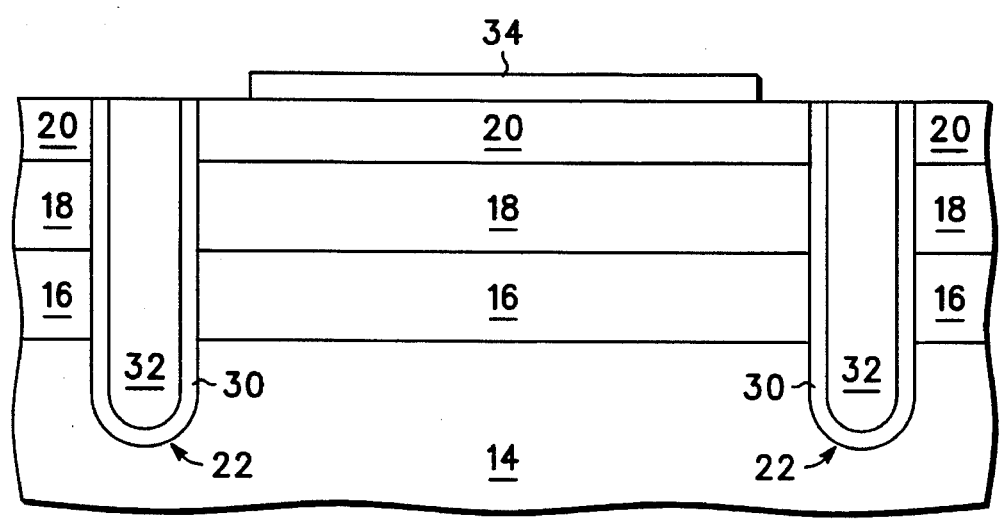

Referring to FIG. 2, oxide layer 26 has been removed for example by reactive ion etching, and nitride layer 28 has been patterned to provide a nitride mask layer 34. Nitride layer 28 is patterned, for example, by reactive ion etching using the polysilicon layer (not shown) of hard-mask 24 as an etch-stop.

Figure 3:
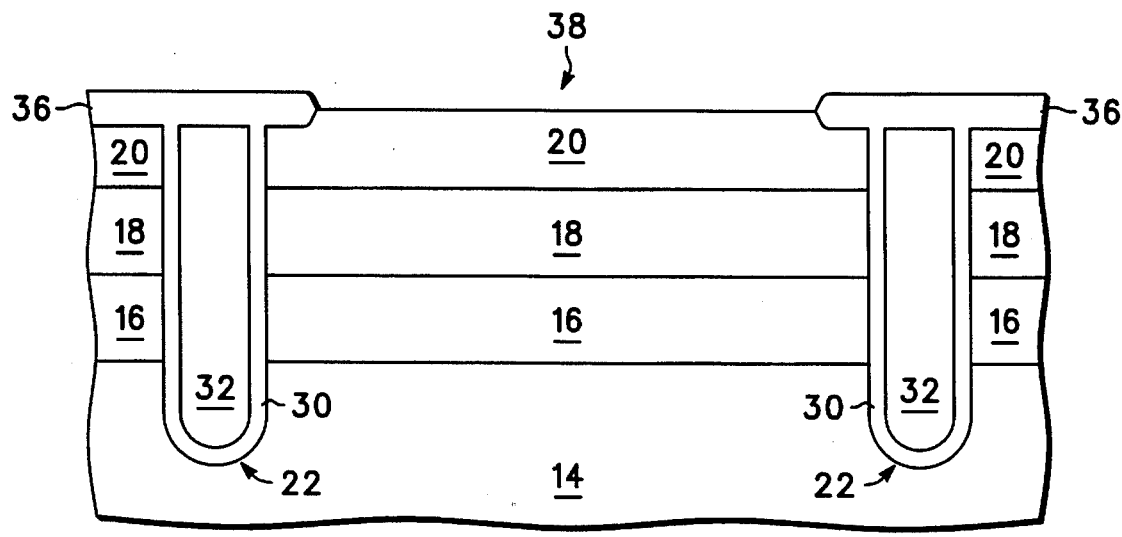

In FIG. 3, nitride mask layer 34 has been used to grow a field isolation layer 36, such as an oxide, using a conventional process in order to define an active area 38. Field isolation layer 36 has a thickness, for example, of about 7,000 angstroms. Next, nitride mask layer 34 and the remaining polysilicon and oxide layers (not shown) of hard-mask 24 are removed, for example, by wet etching to expose epitaxial layer 20 in active area 38.

Figure 4:
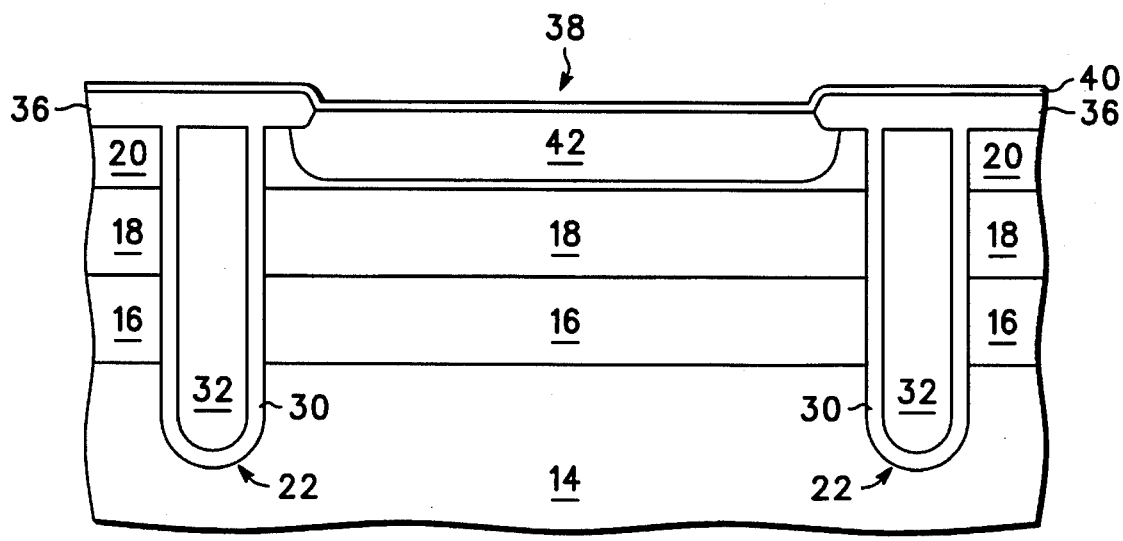

With reference to FIG. 4, a screen oxide layer (not shown) of for example about 400 angstroms is grown in active area 38 of epitaxial layer 20. Then, an insulating layer 40 is formed over field isolation layer 36 and active area 38. Insulating layer 40 is, for example, silicon nitride having a thickness of about 1,000 angstroms. A heavily-doped P-type doped region 42 is optionally formed in epitaxial layer 20, for example, by ion implantation through insulating layer 40 using boron at an implant dose of about $8\times10^{13}/cm^2$ and an energy of about 150 keV. Doped region 42 is activated by annealing, for example, in nitrogen at about 900° C. for 30 minutes. It should be appreciated that doped region 42 is contained substantially within epitaxial layer 20 and is defined at its edges by field isolation layer 36.

Figure 5:
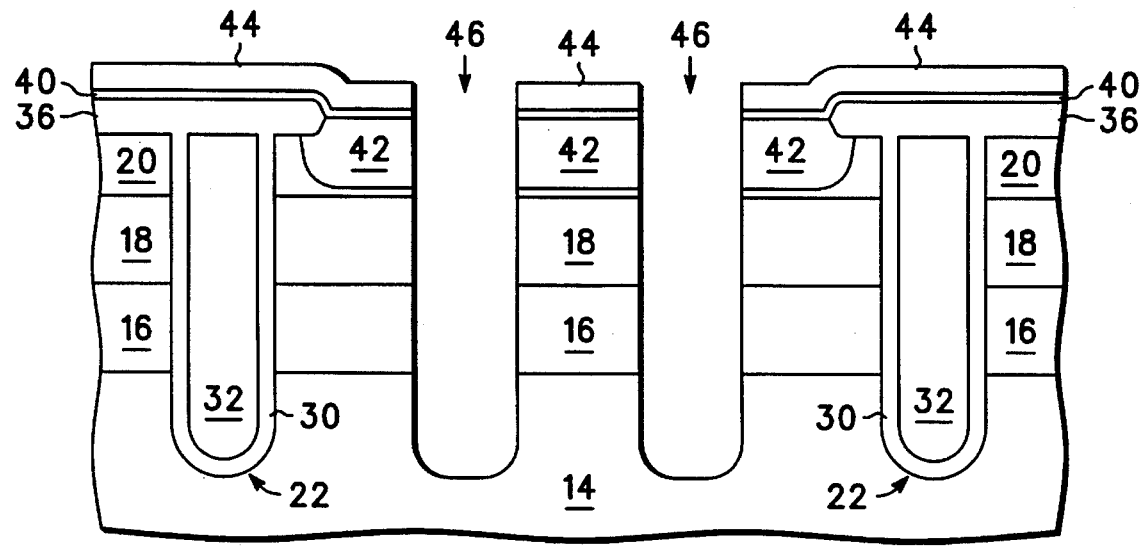

Now referring to FIG. 5, an oxide layer 44 is formed to act as a hard-mask for defining and forming vertical trenches 46. Oxide layer 44 and insulating layer 40 are patterned using known methods, and vertical trenches 46 are then formed using, for example, reactive ion etching, as is known.

Trenches 46 when fully formed extend through epitaxial layers 20, 18, and 16 to wafer 14 and are formed using substantially the same processing techniques used to form isolation trenches 22, as discussed previously. Doped region 42 preferably surrounds each of vertical trenches 46.

Figure 6:
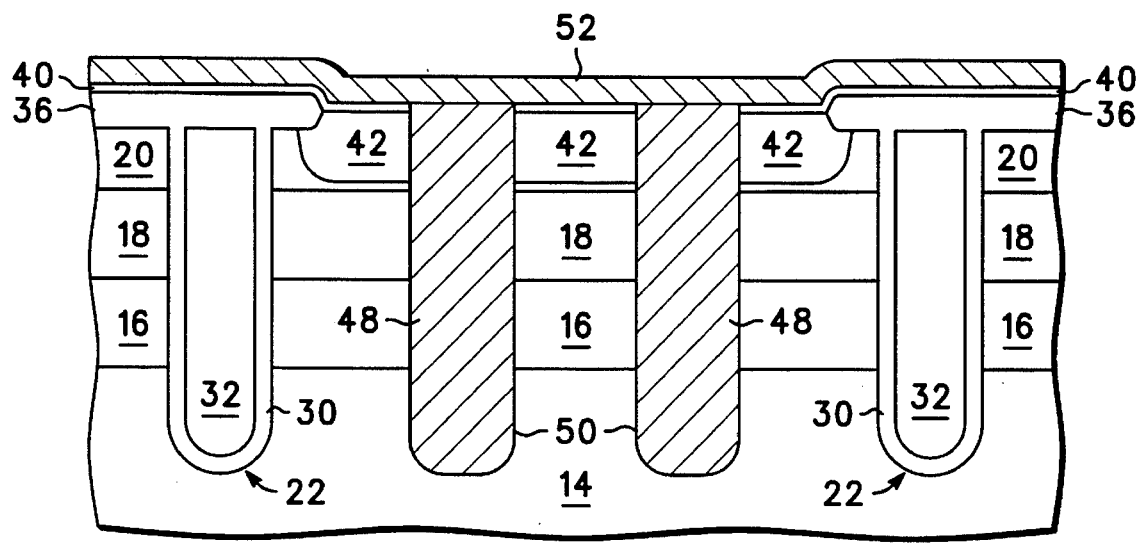

As shown in FIG. 6, vertical trenches 46 have been filled with a conductive material 48 to provide conductive trenches 50. Conductive material 48 may be formed by depositing a polysilicon layer (not shown) to a thickness of, for example, about 8,000 angstroms. This polysilicon layer is heavily doped with boron in-situ during deposition to be P-type, as is known, and then the polysilicon layer is etched back in a standard planarization process using, for example, reactive ion etching.

Next, a bottom electrode layer 52 is formed over and in contact with conductive trenches 50. Bottom electrode layer 52 may be formed by depositing a polysilicon layer to a thickness of about 1,800 angstroms. The polysilicon layer is, for example, preferably doped with boron by ion implantation at an implant dose of about $3.5 \times 10^{15}/cm^2$ at an energy of 20 keV to provide a sheet resistance for bottom electrode layer 52 of about 140 ohms/square. It should be noted that conductive trenches 50 electrically connect bottom electrode layer 52 to semiconductor wafer 14 in the final capacitor and conductive material 48 is preferably heavily-doped P-type polysilicon. Also, conductive trenches 50 are electrically connected to doped region 42 in the final capacitor.

Figure 7:
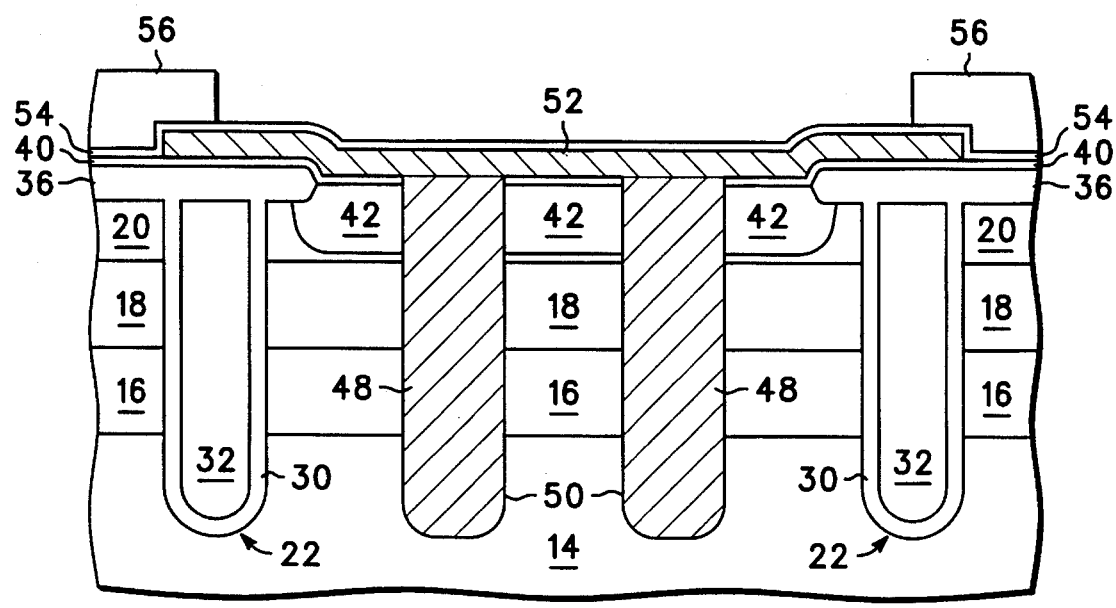

In FIG. 7, bottom electrode layer 52 has been patterned using, for example, reactive ion etching with insulating layer 40 as an etch-stop to define a bottom capacitor electrode. A dielectric layer 54 is formed, for example, by the deposition of a silicon nitride layer of a thickness of about 500 angstroms, and an oxide layer 56 is formed and patterned as is known to provide an opening for a later top electrode, as discussed below. It is preferred that oxide layer 56 be patterned using a wet etchant, with dielectric 54 acting as an etch-stop, to provide better control of the thickness of dielectric layer 54.

Figure 8:
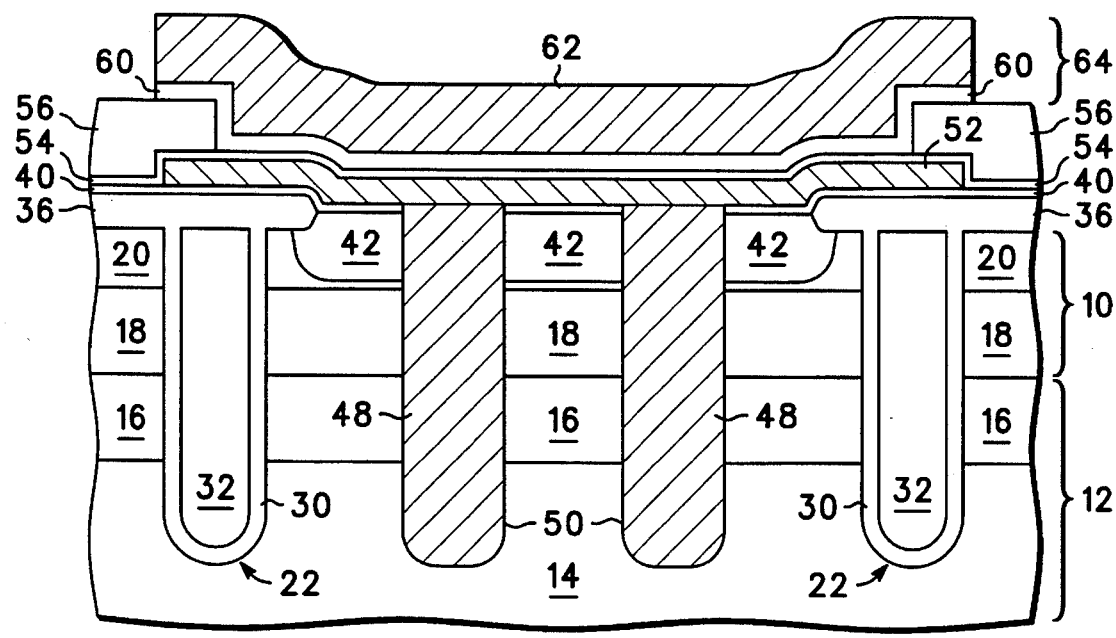

Finally, FIG. 8 illustrates a fully-formed capacitor 58 according to the present invention. A top electrode layer 64, comprising a barrier layer 60 and a metal layer 62, has been formed on dielectric layer 54, as defined by oxide layer 56. By way of example, barrier layer 60 is titanium tungsten deposited to a thickness of about 1,000 angstroms, and metal layer 62 is an aluminum/copper alloy of a thickness of about 6,500 angstroms. Alternatively, it will be appreciated by one of skill in the art that top electrode layer 64 may also include a polysilicon layer in contact with dielectric layer 54.

Thus, capacitor 58 includes top electrode layer 64, dielectric layer 54, and bottom electrode layer 52. Conductive trenches 50 electrically connect bottom electrode layer 52 to semiconductor wafer 14. Preferably, wafer 14 is electrically tied to a ground or other lowest reference potential source, as is known. Therefore, the bottom electrode of capacitor 58 is connected to the potential source without the need for a top-side contact. For example, the back-side of semiconductor wafer 14 may have a metal layer disposed thereon for connection to the ground potential. Top electrode layer 64 is connected conventionally.

An advantage according to the present invention is that the series resistance of bottom electrode layer 52 is significantly reduced compared to prior capacitors that require a top-side contact to the bottom electrode. Specifically, conductive trenches 50 can be provided in a sufficient number so that there is no substantial series resistance between any portion of bottom electrode layer 52 and its closest connection to ground through wafer 14.

As discussed above, doped region 42 is optional. Doped region 42 is preferred because it contributes to a reduction in the series resistance of bottom electrode layer 52 by providing a low resistance electrical path connecting conductive trenches 50.

Although dielectric layer 54 has been described above as being silicon nitride, in other embodiments one of skill in the art will recognize that other suitable dielectrics may be used. Such dielectrics may have a higher dielectric constant than silicon nitride, thus providing a capacitor with an even larger capacitance/area characteristic. Also, numerous conventional materials may be used to form top electrode layer 64. For example, top electrode layer 64 can be a polysilicon layer underneath a metal layer, as used in a double-polysilicon capacitor structure. Further, semiconductor wafer 14 is not limited to silicon, but may be other appropriate semiconductor materials.

Isolation trenches 22 (see FIG. 1) are also optional, but provide the advantage of containing any out-diffusion from optional doped region 42, when used. Thus, isolation trenches 22 permit a closer packing of capacitor 58 with other devices on an integrated circuit.

Top electrode layer 64, due to the novel structure of capacitor 58, can be formed in some cases underneath a bonding pad or a metal power supply bus on an integrated circuit. This is possible because of the absence of any top-side contact for bottom electrode layer 52 as required in prior capacitors. An advantage of placing top electrode layer 64 underneath a bonding pad is a reduction in the layout area required for capacitor 58. This is especially advantageous for large capacitors having a capacitance greater than about 30 pF.

A specific embodiment has been described above, but one of skill in the art will recognize that the present invention can be used in numerous other embodiments. For example, semiconductor wafer 14 can be an N-type material with corresponding changes in the conductivity type of the other layers. Also, capacitor 58 can be formed in structures not having isolation trenches 22. Further, conductive trenches 50 do not have to be etched, but can be formed by other techniques.

By now, it should be appreciated that there has been provided a novel capacitor structure for an integrated circuit. This capacitor reduces the series resistance of the bottom electrode significantly compared to prior capacitors and reduces the layout area required for providing the capacitor in an integrated circuit. Also, the present invention eliminates the need for metal routing over the surface of the integrated circuit to connect one of the capacitor electrodes to a ground potential.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A capacitor for an integrated circuit comprising:

a semiconductor substrate of a first conductivity type;

a semiconductor layer of a second conductivity type having a first opening and overlying said semiconductor substrate;

an insulating layer having a second opening and overlying said semiconductor layer;

a bottom electrode layer overlying said insulating layer;

a dielectric layer disposed on said bottom electrode layer;

a top electrode layer disposed on said dielectric layer; and a conductive trench disposed below said bottom electrode layer and extending through said second opening of said insulating layer and through said first opening of said semiconductor layer to said semiconductor substrate, wherein said conductive trench electrically connects said bottom electrode layer and said semiconductor substrate.

2. The capacitor of claim 1 wherein said semiconductor substrate comprises a semiconductor material of a first dopant concentration and an epitaxial layer of a second dopant concentration disposed on said semiconductor material, wherein said second dopant concentration is less than said first dopant concentration.

3. The capacitor of claim 1 wherein said semiconductor layer comprises a buried layer of a first dopant concentration and an epitaxial layer of a second dopant concentration disposed on said buried layer, wherein said second dopant concentration is less than said first dopant concentration.

4. The capacitor of claim 1 further comprising a doped region disposed in said semiconductor layer, wherein said doped region surrounds said conductive trench.

5. The capacitor of claim 1 wherein said conductive trench is filled with polysilicon and said bottom electrode layer is polysilicon.

6. A capacitor for an integrated circuit comprising:

a silicon semiconductor substrate of a first conductivity type;

a silicon semiconductor layer of a second conductivity type having a first opening and overlying said silicon semiconductor substrate;

a silicon nitride insulating layer having a second opening and overlying said silicon semiconductor layer;

a bottom electrode layer of polysilicon overlying said silicon nitride insulating layer;

a dielectric layer formed of silicon nitride and disposed on said bottom electrode layer;

a top electrode layer disposed on said dielectric layer; and a conductive trench filled with polysilicon and disposed below said bottom electrode layer and extending through said second opening of said silicon nitride insulating layer and through said first opening of said silicon semiconductor layer to said silicon semiconductor substrate, wherein said conductive trench electrically connects said bottom electrode layer and said silicon semiconductor substrate.

7. The capacitor of claim 6 wherein said silicon semiconductor layer comprises a buried layer of a first dopant concentration and a first epitaxial layer of a second dopant concentration disposed on said buried layer, wherein said second dopant concentration is less than said first dopant concentration.

8. The capacitor of claim 7 further comprising a field isolation layer having a third opening corresponding to an active area, wherein said conductive trench contacts said bottom electrode layer substantially within said third opening.

9. The capacitor of claim 8 further comprising a doped region disposed substantially only in said first epitaxial layer, wherein said doped region surrounds said conductive trench and said doped region extends under a portion of said field isolation layer.

10. The capacitor of claim 9 wherein an isolation trench is disposed proximate to said doped region and said isolation trench has an oxide lining and is filled with polysilicon.

11. The capacitor of claim 7 wherein said silicon semiconductor substrate comprises a silicon semiconductor material of a first dopant concentration and a second epitaxial layer of a second dopant concentration disposed on said silicon semiconductor material, wherein said second dopant concentration is less than said first dopant concentration and said buried layer is in direct contact with said second epitaxial layer.

12. The capacitor of claim 11 wherein said first conductivity type is p-type and said conductive trench is doped with a p-type dopant.

\* \* \* \* \*